() United States Patent  (10) Patent No.: US 8,187,731 B2
Weimer et al. (45) Date of Patent: May 29, 2012

(54) METAL FERRITE SPINEL ENERGY STORAGE DEVICES AND METHODS FOR MAKING AND USING SAME

(75) Inventors: Alan W. Weimer, Niwot, CO (US); Christopher Perkins, Boulder, CO (US); Jonathan Scheffe, Westminster, CO (US); Steven M. George, Boulder, CO (US); Paul Lichty, Westminster, CO (US)

(73) Assignee: The Regents of the University of Colorado, Denver, CO (US)

( * ) Notice: Subject to any disclaimer, the term of this patent is extended or adjusted under 35 U.S.C. 154(b) by 0 days.

(21) Appl. No.: 12/774,286

(22) Filed: May 5, 2010

(65) Prior Publication Data

US 2010/0215897 A1 Aug. 26, 2010

(51) Int. Cl.
*C23C 16/44* (2006.01)
(52) U.S. Cl. .......................... 428/702; 428/701; 428/329
(58) Field of Classification Search .......................... None
See application file for complete search history.

(56) References Cited

U.S. PATENT DOCUMENTS

| | | | |
|---|---|---|---|
| 3,399,072 A * | 8/1968 | Pulliam | 117/3 |
| 3,822,210 A * | 7/1974 | Iwase et al. | 252/62.64 |
| 4,032,674 A * | 6/1977 | Hirabayashi et al. | 427/130 |
| 4,717,584 A | 1/1988 | Aoki | |
| 5,290,589 A | 3/1994 | Clough | |
| 5,603,983 A | 2/1997 | Clough | |
| 5,626,956 A * | 5/1997 | Hopstock et al. | 428/323 |
| 5,756,207 A | 5/1998 | Clough | |
| 6,488,908 B1 * | 12/2002 | Kawai et al. | 423/594.2 |
| 6,613,383 B1 | 9/2003 | George | |
| 6,713,177 B2 | 3/2004 | George | |
| 2004/0007071 A1 * | 1/2004 | Masuda | 73/700 |
| 2004/0199019 A1 * | 10/2004 | Schmidt | 564/480 |
| 2005/0048323 A1 * | 3/2005 | Zinbo | 428/694 BH |
| 2005/0155779 A1 * | 7/2005 | Wang et al. | 174/35 MS |
| 2006/0102871 A1 * | 5/2006 | Wang et al. | 252/62.51 R |
| 2006/0249705 A1 * | 11/2006 | Wang et al. | 252/62.51 C |
| 2007/0010702 A1 * | 1/2007 | Wang et al. | 600/8 |

OTHER PUBLICATIONS

Hakim et al., Synthesis of Oxidation-Resistant Nanoparticles . . . : Nanotechnology 18 (2007) 345603.
Lie et al., "Growth of iron cobalt oxides by atomic layer deposition", Dalton Transactions 2008,253-259.

* cited by examiner

*Primary Examiner* — Jennifer McNeil
*Assistant Examiner* — Vera Katz
(74) *Attorney, Agent, or Firm* — Gary C Cohn

(57) ABSTRACT

1-100 nm metal ferrite spinel coatings are provided on substrates, preferably by using an atomic layer deposition process. The coatings are able to store energy such as solar energy, and to release that stored energy, via a redox reaction. The coating is first thermally or chemically reduced. The reduced coating is then oxidized in a second step to release energy and/or hydrogen, carbon monoxide or other reduced species.

7 Claims, No Drawings

METAL FERRITE SPINEL ENERGY STORAGE DEVICES AND METHODS FOR MAKING AND USING SAME

STATEMENT OF GOVERNMENT INTEREST

This invention was made with government support under grant number DE-FG36-06GO15044 awarded by the U. S. Department of Energy. The government has certain rights in this invention.

This application claims priority and benefit of PCT patent application Publication Number WO2009/061795, Serial Number PCT/US2008/082449, filed Nov. 5, 2008, titled "METAL FERRITE SPINEL ENERGY STORAGE DEVICES AND METHODS FOR MAKING AND USING SAME," which in turn claims priority from and benefit of both U.S. Provisional Application No. 61/001,867, filed 5 Nov. 2007 and Application No. 61/091,215, filed 22 Aug. 2008.

There is an increasing desire to capture solar energy and use it as a power source. Solar energy can be concentrated and used directly to heat water or other materials. Solar energy also can be converted to electricity, directly using photovoltaic cells or indirectly by various means, such as by using the solar energy to generate steam which is then used to operate a turbine.

A major problem with solar energy, of course, is that the availability of solar power depends on the time of day, the season of the year and the local weather conditions. Therefore, at certain times, more solar energy might be produced than can be used, and at other times, solar energy is not available at all, and power must be obtained from other sources. More consistent energy production could be seen if there was an economical way to capture and store the solar energy and use the captured energy during times when solar power is not available.

One way of doing this is to use a high heat transfer storage medium to store the solar energy. In essence, a large mass of some storage medium is heated during periods of strong sunlight. The hot material is then stored until a period of diminished sunlight, and the sensible heat is used to generate steam or drive chemical reactions to produce energy. The most usual storage medium is molten salt, but that material has a maximum usage temperature of only about 500° C. This limits the amount of energy that can be stored. More recently, silica has been used as a storage medium. Silica can be heated to higher temperatures and therefore can store more energy than can molten salt.

The problems with the heat transfer storage medium approach are 1) very large masses of storage medium must be stored and handled; 2) much of the captured heat is lost through the walls of storage vessels and handling equipment and (3) the hot storage medium only remains useful for a short period of time until it cools to a temperature too low for it to be used efficiently. These problems greatly limit the storage medium approach.

Certain ferrite spinel materials are capable of engaging in redox reactions, in which the materials are partially or fully reduced and then re-oxidized. The reduction step can be performed thermally by heating the ferrite spinel to high temperature. The oxidation step can be performed by exposing the reduced ferrite spinel to water or oxygen. Exposure to water produces hydrogen, and can also release heat. Exposure to oxygen also releases heat.

Thus, for example, Tamaura et al., in "Production of Solar Hydrogen by a Novel, 2-step-Water-Splitting Thermochemical Cycle", *Energy*, 1995, 20(4): 325-330, and in "Thermodynamic evaluation of water splitting by a cation-excessive (Ni, Mn) ferrite", *Intern. J. Hydrogen Energy*, 1998, 23(12): 1185-1191 describe heating a nickel manganese ferrite spinel to 1073K to reduce it to sub-stoichiometric, oxygen-deficient ferrites, and then reoxidizing this material in the presence of water at 873 K. However, hydrogen production was seen to decrease over each repetition of the cycle. The substoichiometric reduction that is seen in these cases limits the energy storage capacity which in turn limits the capacity of the material to generate hydrogen or release heat in the oxidation step.

A zinc ferrite spinel can be fully reduced at very high temperatures (1750-1800 K). At these very high temperatures, zinc vaporizes and thus separates from the iron. Therefore, reoxidation does not result in regeneration of the ferrite spinel, and the system for that reason is not capable of being used in multiple cycles.

Cobalt and nickel ferrite spinels have been coated on zirconia particles and evaluated by Kodama et al., in "Thermochemical hydrogen production by a redox system of $ZrO_2$-supported Co(II)ferrite", *Solar Energy* 2005, 78(5): 623-631; "Thermochemical two-step water splitting by $ZrO_2$-supported $Ni_xFe_{3-x}O_4$ for solar hydrogen production", *Solar Energy* 2008, 82:73-79 and "A two-step thermochemical water spitting by iron-oxide on stabilized zirconia", *J. Solar Energy Engineering* 2006, 128, 3-7. These systems can be sub-stoichiometrically reduced at 1173 K. They were found capable of maintaining their ability to produce water over several reaction cycles. Again, the substoichiometric reduction limits the capacity of the material to produce hydrogen or release heat. Kodama's group found that these materials became significantly less reactive as they sintered and as loadings of the ferrite spinel increased on the support. Most of the ferrite spinel material remained more or less inactive, and the amount of hydrogen that was produced was much lower than expected based on the amount of the ferrite spinel on the support.

Therefore, it remains desirable to provide an efficient energy transfer storage material.

In one aspect, this invention is a substrate having a metal ferrite spinel coating of from 1 nm to 100 nm thickness on at least a portion of the surface thereof, wherein the substrate is thermally and oxidatively stable to a temperature of at least 900° C., and the metal ferrite spinel has the empirical formula $M_xFe_{3-x}O_4$, wherein M is a transition metal and x is a number from 0.25 to 1.5. In especially preferred embodiments, the coating is from 1 to 30 nm thick or from 1 to 10 nm thick.

The coating preferably is applied via an atomic layer deposition process. Therefore, in another aspect, this invention is a method of forming a 1-100 nm-thick metal ferrite spinel coating having the approximate empirical formula $M_xFe_{3-x}O_4$, wherein M is a transition metal and x is a number from 0.25 to 1.5, comprising depositing, via an atomic layer deposition process (1) an iron oxide layer onto the surface of a substrate having a metal M oxide surface, (2) at least one metal M oxide layer onto the surface of a substrate having an iron oxide surface, or (3) both iron oxide and a metal M oxide onto the surface of a substrate. In certain embodiments, the substrate is subjected to one or more reaction cycles during the atomic layer deposition process, wherein in each reaction cycle the substrate is exposed to a mixture of a gaseous iron precursor and a gaseous M-containing precursor and then separately exposed to a gaseous oxidant, under conditions that the gaseous iron precursor, gaseous M-containing precursor and oxidant react at the surface of the substrate to form a metal ferrite spinel coating having the approximate empirical formula $M_xFe_{3-x}O_4$.

In this process, the iron oxide and metal M oxide react either during the atomic layer deposition process or in a subsequent heating step to form a metal ferrite spinel having the approximate empirical formula $M_xFe_{3-x}O_4$ where M and x are as before. Excess iron or metal M oxide may be present in the coating as well.

The invention is in another aspect an energy storage and transfer process, comprising:

(1) subjecting a coated substrate having a 1 to 100 nm metal ferrite spinel coating that has the approximate empirical formula $M_xFe_{3-x}O_4$, wherein M is a transition metal and x is a number from 0.25 to 1.5, in the presence of an inert atmosphere to conditions sufficient to reduce the metal ferrite spinel to release oxygen and convert at least a portion of the metal ferrite spinel to reduced species bonded to the surface of the substrate, and then (2) contacting the coated substrate with an oxidant under conditions such that the reduced species are oxidized to re-form a metal ferrite spinel coating on the substrate and produce hydrogen, release heat, or both produce hydrogen and release heat. In certain embodiments, the metal ferrite spinel coating is deposited by an atomic layer deposition process as described before.

Step (1) of the energy storage and transfer process is preferably performed thermally, by subjecting the coated substrate to a temperature sufficient to reduce the metal ferrite spinel coating. The oxidant in step (2) of the energy storage and transfer process can be, for example, molecular oxygen, either by itself or in a mixture with other gases (such as air), carbon dioxide, hydrogen peroxide or water. When molecular oxygen is the oxidant, heat is released. Carbon monoxide is produced when the oxidant is carbon dioxide, and heat may be released as well. When water or hydrogen peroxide is used as the oxidant, the water or hydrogen peroxide is split to produce hydrogen and may also release heat. In preferred embodiments, step (1) is conducted using solar energy, which most preferably is concentrated. Steps (1) and (2) can be separated quite substantially in time, the reduced ferrite spinel coating in effect performing the function of an energy storage medium.

In certain specific embodiments, this invention is also a method of forming a mixed metal coating on the surface of a substrate by an atomic layer deposition process, wherein the substrate is subjected to one or more reaction cycles, each of which reaction cycles includes (a) at least one iron oxide-deposition subcycle that includes separately exposing the substrate to a gaseous iron precursor and a gaseous oxidant under conditions such that the gaseous iron precursor and the gaseous oxidant react at the surface of the substrate to form an oxide of iron and (b) at least one metal M oxide-deposition subcycle that includes separately exposing the substrate to a gaseous M-containing precursor and a gaseous oxidant under conditions such that the gaseous M-containing precursor and the gaseous oxidant react at the surface of the substrate to form an oxide of the metal M.

Each of the subcycles can be performed one time, or multiple times, during each full reaction cycle. The relative amounts of iron oxide and metal M oxide that are deposited in each full reaction cycle can be controlled by the relative number of times each subcycle is repeated within the full reaction cycle. Each subcycle can be repeated from 1 to 50 times or more, preferably from 1 to 10 times. The times each subcycle is repeated are selected to provide the desired molar ratio of iron to the metal M in the coating. The number of full cycles is selected to provide the desired overall film thickness, which is suitably from 1 nm to 100 nm and can be from 1 to 30 nm or from 1 to 10 nm.

The coated substrate of this invention offers several advantages. An important and surprising advantage is that the metal ferrite spinel coating can be stoichiometrically reduced at lower temperatures than has been seen with previous metal ferrite spinels. This effect is seen more clearly when the coating is no greater than 30 nm thick and even more clearly when the coating thickness is 10 nm or less. The cobalt ferrite spinel coatings, for example, can be stoichiometrically reduced in a temperature range as low as from 900 to 1200° C. This somewhat low temperature is very significant from an engineering point of view, as it allows one to manufacture handling and storage equipment out of less expensive, more commonly available materials than could be used otherwise. Similarly, a wider range of support materials can be used at the lower temperatures. The ability to stoichiometrically reduce the metal ferrite spinel at these temperatures means that the process can take advantage of the high storage capacity of the stoichiometrically reduced metal ferrite spinel while still operating at reasonable temperatures.

Another advantage of the invention is that, due to the ability to stoichiometrically reduce the coating more easily, the material stores energy very efficiently. Still another advantage is that a high proportion of the metal ferrite spinel can be reduced readily in the reduction step, which further increases the energy storage capacity. The oxidation step also proceeds at good rates with good recovery of the stored energy.

As a result, the coated substrate of the invention is particularly suitable as a solar energy storage material. It can be used to capture and store solar energy that is obtained during daylight hours and to release the energy during periods of time or in places in which solar energy is not readily available or is too diffuse to make use of economically.

In another specific embodiments, this invention is a process comprising forming an ultrathin layer of a mixed iron oxide/cobalt oxide on a substrate by an atomic layer deposition process, wherein the substrate is subjected to one or more reaction cycles, each of which reaction cycles includes (a) at least one iron oxide-deposition subcycle that includes separately exposing the substrate to gaseous ferrocene and oxygen under conditions such that the ferrocene and oxygen react at the surface of the substrate to form iron oxide and (b) at least one cobalt oxide-deposition subcycle that includes separately exposing the substrate to gaseous cobaltocene and oxygen under conditions such that the cobaltocene and oxygen react at the surface of the substrate to form cobalt oxide.

Each of the subcycles can be performed one time, or multiple times, during each full reaction cycle. The relative amounts of iron oxide and cobalt oxide that are deposited in each full reaction cycle can be controlled by the relative number of times each subcycle is repeated within the full reaction cycle. Also as before, each subcycle can be repeated from 1 to 50 times or more, preferably from 1 to 10 times. The number of full cycles is selected to provide the desired overall film thickness. The coated substrate may be subjected to elevated temperatures such that the iron oxide and the cobalt oxide layers react with each other to form a ferrite spinel having the approximate empirical formula $CoFe_2O_4$.

The coated substrate of the invention includes a substrate material that is at least partially coated with a metal ferrite spinel. The substrate is chosen such that (1) it is thermally and chemically stable under the conditions of the process by which the metal ferrite spinel coating is applied, (2) has a high surface area and (3) it is suitable for the intended end-use application in which the coated substrate will be used. In particular, the coated substrate should be thermally and chemically stable under the conditions under which the metal ferrite spinel coating is reduced to store energy, and under which the coating is then re-oxidized to release heat. These temperature conditions may range from 900° C. to 1700° C. or more. The substrate particles may be an inorganic or organic material. Inorganic substrates of interest include silica, alumina, zirconia, iron oxide, an oxide of the metal M (particularly a cobalt oxide or a nickel oxide), boron nitride, tungsten carbide, titanium carbide, molybdenum carbide, mullite, aluminum titanate, metals such as iron, and the like. Alumina or alumina-containing substrates are particularly interesting, as alumina may react during the reduction step to form iron aluminum oxides. The availability of this reaction may in some cases reduce the temperatures needed during the reduction step, to 1200° C. or below.

The substrate may be in the form of a particulate. The particles may have an average diameter of from 10 nm to 50 mm. A particle size range of interest is from 10 nm to 1 mm, and a particle size range of particular interest is from 20 nm to 500 nm.

A porous substrate preferably is a porous material that has a BET surface area of at least 2 $m^2/g$ and preferably at least 10 $m^2/g$. High porosity permits more of the metal spinel coating to be applied and also provides a large exposed surface area at which the coating can react in the reduction and oxidation steps to store and release heat.

Another high surface area substrate of interest is a microchannel device. Microchannel devices that are suitable as substrates include those described, for example, by Cao in *Catalysis Today,* 2007, 125:29-33; Stefanescu in *Catalysis Today,* 2007, 125:16-23 and Brooks in *Chemical Engineering Science* 2007, 62:1161-1170.

Yet another type of high surface area is a metal fiber, which can be in the form of a wool, or a metal foam. The metal can be any that can withstand the temperatures of forming the coating and of the subsequent use of the coated metal fiber or foam. Steel wool is an example of such a metal fiber substrate, but other metal wools such as nickel wool are also suitable.

The substrate is coated with a metal ferrite spinel coating. The metal ferrite spinel has the approximate empirical formula $M_xFe_{3-x}O_4$, wherein M is a transition metal and x is a number from 0.25 to 1.5. M is preferably Mn, Zn, Co, and Ni, with Co and Ni being more preferred. X is preferably from 0.35 to 1.5 and even more preferably from 0.5 to 1.3. The coating may contain, in addition to the metal ferrite spinel, domains of iron oxide and/or the metal M oxide may be present. This may be due, for example, to an excess of one or the other metal in the coating, or due to incomplete spinel formation during the coating process.

The metal ferrite spinel coating is from 1 to 100 nm thick, and more preferably is from 1 to 50 nm thick and even more preferably from 1 to 30 nm thick. The metal ferrite spinel coating may be from 1 to 10 nm thick. Thinner coatings, particularly those up to 30 nm and especially those of up to 10 nm in thickness, are unexpectedly advantageous. The substoichiometric and in many cases the stoichiometric reduction of these very thin films tends to occur at unexpectedly low temperatures. In addition, the reduction and subsequent oxidation reactions tend to occur more rapidly and more completely with these very thin coatings. In addition, the coating is preferably uniform in thickness and also preferably is conformal.

The metal spinel coating may constitute from 1 to 50 percent of the combined weight of the support and the coating. Higher loadings are generally obtainable without exceeding the thickness requirement by using a higher surface area substrate. A preferred loading is from 10 to 30% by weight, based on the combined weight of support and coating.

The metal spinel coating is preferably formed by depositing an iron oxide, a metal M oxide, or both, onto the surface of the substrate, using an atomic layer deposition (ALD) process. ALD is a method by which ultra-thin, conformal coatings can be applied to a variety of substrates. In ALD, the reaction is split into two or more half-reactions, by introducing gas phase reactants separately and alternatingly into the deposition chamber. Each reactant reacts at the surface of the substrate, each in turn forming a mono-layer of deposited material. Excess amounts of reactant are removed from the reaction zone before introducing the next reactant. Reaction by-products are removed as well, between successive introductions of the reagents. This procedure ensures that reactions occur at the surface of the substrate, rather than in the gas phase. In this way, highly conformal, ultra-thin films can be deposited.

A purge gas is typically introduced between the alternating feeds of the reactants, in order to further help to remove excess reactants. A carrier gas, which is usually but not necessarily the same as the purge gas, generally (but not always necessarily), is introduced during the time each reactant is introduced. The carrier gas may perform several functions, including (1) facilitating the removal of excess reactant and reaction by-products, (2) distributing the reactant through the reaction zone, thereby helping to expose all substrate surfaces to the reactant and (3) fluidizing a particulate substrate so that all particle surfaces become exposed to the reactant. The purge gas does not react undesirably with the ALD reactants or the deposited coating, or interfere with their reaction with each other at the surface of the metal particles.

A typical pattern of introducing reactants (in a two-reagent ALD reaction scheme is:

1. Optionally, introduce purge/fluidizing gas.
2. Introduce mixture of carrier gas and first reagent (iron precursor or M-containing precursor, depending on the particular sub-cycle).
3. Introduce purge/fluidizing gas and/or pull a high vacuum to remove excess quantities of the first reagent as well as reaction by-products.
4. Introduce mixture of carrier gas and second reagent, which is in this case an oxidizing agent).
5. Introduce purge/fluidizing gas and/or pull a high vacuum to remove excess quantities of the second reagent and reaction by-products.
6. Repeat steps 2-5 until desired coating thickness is obtained.

Such atomic layer controlled growth techniques permit the formation of deposits of up to about 0.3 nm in thickness per reaction cycle, and thus provide a means of extremely fine control over deposit thickness. The reactions are self-limited and can be repeated to sequentially deposit additional layers of the deposited material until a desired thickness is achieved. During the first reaction cycle, the first reagent will react with functional groups on the surface of the substrate to form a covalent bond to the substrate. If necessary, a preliminary reaction can be conducted at the substrate surface to introduce functional groups. Subsequent reaction cycles build the coating onto the substrate surface.

Reaction conditions are selected mainly to meet two criteria. The first criterion is that the reagents are gaseous under the conditions of the reaction. Therefore, temperature and pressure conditions are selected such that the reactants are volatilized. The second criterion is one of reactivity. Conditions, particularly temperature, are selected such that the desired reaction between the film-forming reagents (or, at the start of the reaction, the first-introduced reagent and the particle surface) occurs at a commercially reasonable rate.

The temperature of the reactions may range from 300-1000K. The temperature is preferably one at which the substrate is thermally stable and below the melting, decomposition and, if appropriate, glass transition temperature of the substrate.

Subatmospheric pressures will normally be required.

The progress of the reaction can be monitored using techniques such as transmission. Fourier transform infrared techniques, Auger electron spectroscopy, and mass spectrometry.

If the substrate already has an iron oxide surface, it is sufficient to deposit only the metal M oxide onto the surface of the substrate via the atomic layer deposition process. In such a case, the substrate may be made of iron oxide, or made of iron which has a surface oxide layer, or made of a substrate of yet another material which has an iron oxide coating that has been applied by some other process, such as CVD, sputtering, sol-gel process, and the like. The iron oxide ALD process involves alternatingly and separately contacting the surface of the particle with a gaseous iron precursor and a gaseous oxidant.

Similarly, if the substrate already has a metal M oxide surface, it is sufficient to deposit only the iron oxide onto the surface of the substrate via the atomic layer deposition process. In such a case, the substrate may be made of the metal M oxide, or made of the metal M which has a surface oxide layer, or made of a substrate of yet another material which has a metal M oxide coating that has been applied by some other process, such as CVD, sputtering, sol-gel process, and the like. The metal M oxide ALD process involves alternatingly and separately contacting the surface of the particle with a gaseous metal M precursor and a gaseous oxidant.

When other substrates are used, the ALD reaction cycle must accommodate both the iron precursor and the M-containing precursor. This can be done in various ways. In one approach, the iron precursor and the M-containing precursor are introduced as a mixture of gases, and both metals are deposited simultaneously. More preferably, however, the ALD process is broken into sub-cycles, one sub-cycle in which the iron precursor is introduced and another in which the M-containing precursor is introduced. This approach alternatingly deposits an oxide of iron and an oxide of the metal M. The coating produced in this process may have distinct layers of the iron oxide and the metal M oxide. However, in many cases, especially when the number of subcycles is small in each reaction cycle, the coating is a mixed oxide coating in which individual iron oxide and metal M oxide layers cannot easily be detected.

In some embodiments, the substrate is subjected to one or more reaction cycles, each of which reaction cycles includes (a) at least one iron oxide-deposition subcycle that includes separately exposing the substrate to a gaseous iron precursor and a gaseous oxidant under conditions such that the iron precursor and the gaseous oxidant react at the surface of the substrate to form an iron oxide and (b) at least one metal M oxide-deposition subcycle that includes separately exposing the substrate to gaseous M-containing precursor and a gaseous oxidant under conditions such that the M-containing precursor and gaseous oxidant react at the surface of the substrate to form an oxide of the metal M.

The ratio of iron to the metal M in the coating is controlled in this process through the number of times the sub-cycles are repeated during each reaction cycle. A higher proportion of the metal M is provided by increasing the relative number of sub-cycles that include the M-containing precursor, and vice versa.

The metal ferrite spinel may in some cases form directly during the ALD deposition process. In other cases, the ALD deposition process can form more distinct layers or domains of the iron oxide and the metal M oxide. In the latter case, metal ferrite spinel formation may be promoted by heating the coated substrate. This promotes inter-layer reactions between the iron oxide and metal M oxide layers. Some diffusion of the iron and the metal M is also believed to occur during this heating step. The heating can be performed under conditions which disfavor the thermal reduction of the coating. Therefore, the temperature during the heating step is below that at which the thermal reduction occurs, and/or the heating is performed in the presence of an oxidizing atmosphere. Preferably, the heating step, if needed, is conducted at a temperature of up to 1000° C., such as from 500 to 900° C. However, if reduction does occur during the heating step, the material can be re-oxidized by exposure to oxygen or water as described below. The heating step may also cause at least a portion of the coating to crystallize.

The metal ferrite spinel coating may contain domains of the iron oxide and the metal M oxide, in varying amounts.

The iron precursor is an iron compound that is a gas under the conditions of the ALD reaction, and which can react with the oxidant to form the corresponding oxide under the conditions of the ALD reaction. The iron precursor should have a vapor pressure of at least 0.1 Torr, preferably at least 1 Torr under the temperature and pressure conditions of the ALD reaction. Ferrocene is a suitable iron precursor.

Similarly, the M-containing precursor is a compound of the metal M, which is a gas under the conditions of the ALD reaction, and which can react with the oxidant to form the corresponding oxide under the conditions of the ALD reaction. The M-containing precursor should have a vapor pressure of at least 0.1 Torr, preferably at least 1 Torr under the temperature and pressure conditions of the ALD reaction. Metallocenes such as cobaltocene and nickelocene are suitable.

The oxidant used in the ALD process is preferably molecular oxygen. Oxygen can be used as a pure gas, or as a mixture with one or more other gases. Oxygen may be mixed with a purge or sweep gas. Other materials which are gaseous under the ALD reaction conditions and which react under those conditions to form an oxide with iron or the metal M can be used, such as, for example, carbon dioxide, hydrogen peroxide or water.

Metal ferrite spinel-coated substrates in accordance with the invention can be used as energy storage and transfer media. For this application, the preferred metal ferrite spinels are cobalt ferrite spinel, which has the approximately empirical formula $Co_xFe_{3-x}O_4$, and nickel ferrite spinel, which has the approximate empirical formula $Ni_xFe_{3-x}O_4$ in which x is as defined before. Mixed cobalt/nickel ferrite spinels also can be used. Energy is stored by reducing the metal ferrite spinel coating on the substrate. This can be done thermally, chemically, or by some combination of both.

The metal ferrite spinel coating can be reduced thermally by heating the coated substrate to a temperature sufficient to reduce at least part of the metal ferrite spinel. This releases oxygen and converts at least a portion of the metal ferrite spinel to reduced species. The reduced species typically include an iron oxide and a metal M oxide, which remain bonded to the surface of the substrate. In some cases, the reduced species may include atoms from the substrate. An alumina substrate, for example, has been found engage in a reaction during the thermal reduction step to form iron aluminum oxide species that have the approximate empirical formula $FeAl_2O_4$.

The temperature required to thermally reduce the metal ferrite spinel may vary depending on the particular metal ferrite spinel. Furthermore, the temperature may be selected so that a substoichiometric reduction occurs, or so the stoichiometric reduction occurs. In a stoichiometric reduction, a mole of the metal spinal ferrite releases one-half mole of molecular oxygen and is believed to form MO (where M is the metal) and FeO. In a substoichiometric reduction, less than one-half mole of molecular oxygen, typically from 0.25 to 0.49 mole of molecular oxygen is released per mole of the metal ferrite spinel, and the reduced material is believed to have the approximate empirical formula $M_xFe_{3-x}O_{4-y}$, where y is from 0.5 to 1.0. In some cases (as when the substrate includes alumina), atoms from the substrate may engage in reactions to form iron aluminum oxide species.

The temperature used in a thermal reduction is typically from about 800° C. to as much as 1800° C. The upper temperature is limited by the vaporization temperature of the M metal or of its oxide, or, of lower, the vaporization temperature of iron or iron oxide. However, an advantage of this invention is that the needed temperatures are often somewhat moderate. Therefore a preferred temperature range is from 900 to 1500° C. and an even more preferred temperature range is from 900 to 1200° C.

A thermal reduction is performed under an inert atmosphere or a vacuum. An inert atmosphere is one which does not react with the coated substrate under the conditions of the reduction step. The inert atmosphere should be non-oxidizing. Hydrogen, nitrogen, argon, a mixture of any two or more of these, and the like are all suitable. It is preferred to conduct the reduction step under a flowing purge gas, in order to sweep oxygen out of the system as it is produced.

The energy used to heat the coated substrate to the reduction temperature can come from any source. However, solar energy is of special interest. Solar energy is suitably concentrated and the concentrated energy is transferred to the coated substrate. Any solar concentrator that is capable of producing the necessary temperature is suitable, and can be based on mirrors, Fresnel lenses or other devices which focus and concentrate solar energy. The concentrator preferably can deliver at least 1000 suns concentration, more preferably at least 2000 suns concentration, even more preferably at least 3,000 suns concentration and most preferably at least 4,000 suns concentration.

A thermal reduction step can be carried out in a solar energy receiver that contains one or more tubes. The coated substrate is contained within the tubes and the tubes are exposed to the concentrated sunlight and heated to the reduction temperature. The coated substrate can be made to move through the tubes in a continuous or semi-continuous process. The inert gas flows through the tubes, typically counter-current to the movement (if any) of the coated substrate.

A chemical reduction is performed by contacting the coated substrate with a reducing agent. Suitable reducing agents include, for example, hydrogen, carbon monoxide and other reducing gases. Mixtures of two or more reducing agents can be used. Gaseous reducing agents can be mixed with other gases which are non-oxidizing and preferably inert. A specific reducing agent is syngas, which is a mixture of hydrogen, carbon monoxide and optionally other gases. Syngas can be produced from biological resources and/or fossil fuels. In an especially preferred process, the syngas is generated by pyrrolyzing plant material. The plant material can be a lignocellulosic feedstock. The biomass can be converted to syngas by heating the biomass to a temperature of 1100° C. or higher. Solar energy can be used to provide the thermal energy needed for such pyrrolysis, as described, for example, in U. S. Published Patent Application No. 20080086946.

The reduced material is collected and stored until such time as the stored energy is needed. The reduced material should be stored in an environment that excludes oxidants such as molecular oxygen, air, carbon dioxide, hydrogen peroxide and water. It is preferred to store the reduced material in a thermally insulated vessel, to minimize losses of sensible heat, which can be recovered and used. However, the reduced material still has stored energy even when the sensible heat is lost.

Energy stored in the reduced material is recovered by oxidizing the reduced coating to re-form the metal ferrite spinel. This is done by contacting the reduced material with an oxidant, typically molecular oxygen (which may be mixed with one or more other gases), air, carbon dioxide, hydrogen peroxide or water. The oxidation reaction is suitably conducted at a temperature of from 100 to 1800° C., preferably from 800 to 1300° C. in the case in which water is the oxidant. The oxidation reaction to release heat is preferably conducted with air from 200 to 500° C.

Oxidation using molecular oxygen is exothermic, and so releases energy in the form of heat. The heat can be captured and used in any convenient way. For example, the heat can be used to produce steam, which can be used to drive a turbine and produce electricity. Similarly, the heat can be used to heat any other thermal working fluid as may be wanted in a particular application. The heat can also be used in any other way in which heat energy can be captured and used to perform useful work.

Oxidation using carbon dioxide produces carbon monoxide, and oxidation using hydrogen peroxide or water produces hydrogen. In most cases, these processes will also release energy in the form of heat. The heat can be used as before to create steam and drive a turbine to produce electricity, or can be captured and used in any other convenient way to perform useful work. The carbon monoxide and hydrogen are fuel themselves. In effect, energy that is stored in the reduced coating is transferred to and stored in the carbon monoxide or hydrogen that is produced. The carbon monoxide hydrogen can be used as a fuel for producing energy, or can be used as a reagent in any of a wide range of chemical reactions. The hydrogen that is produced, for example, can be used in a variety of hydrogenation or reduction reactions.

Some of the energy that is used to reduce the coating goes into heating the coated substrate. That portion of the energy is therefore stored in the coated substrate in the form of sensible heat, as the material will attain a temperature of from 800 to 1800° C. during the reduction step. This stored energy is in addition to that which is stored as a result of the reduction of the metal ferrite spinel. Greater efficiencies are of course obtained if some or all of that sensible heat can be captured and used to perform useful work.

Therefore, in particularly preferred processes, at least a portion of the sensible heat gained by the storage material in the reduction step is recovered from the material and used to perform useful work. Sensible heat can be recovered from the storage material of this invention in the same way as it is recovered from conventional storage materials such as molten salt. Sensible heat can be recovered from the storage material so long as it remains hot. Therefore, if it is desired to store that sensible heat and use it at some later period, the storage medium should be kept in a thermally insulated environment in order to minimize losses of the sensible heat.

This sensible heat can be captured and used before, during or after the oxidation step. For example, the heated storage material can be used to produce steam and produce electricity as described before, prior to oxidizing the reduced storage medium. In this case, the storage material of the invention is used in the same way as conventional storage materials such as molten salt. Alternatively, sensible heat from the storage material can be captured and used at the same time as the oxidation step is performed. Similarly, residual heat retained by the storage material after the oxidation step is completed can be captured and used in analogous ways. It is noted that some of the heat released in the oxidation step will usually go towards heating the storage material, and efficient recovery and use of the stored energy will normally include some recovery of that sensible heat as well.

In one process, the reduced storage material is placed in contact with tubes, which contain water or other thermal working fluid. A flow of the oxidant is established through the reduced storage material, and the tubes (and their contents) are heated by the energy released from the storage material. As mentioned, this energy can be sensible heat, energy released in the exothermic oxidation reaction, or some combination of both. In the especially preferred process, the water or working fluid is vaporized (to produce steam in the case of water), and the steam can be used to operate a turbine to generate electricity. The steam or other vapor also can be used as a heat transfer or working fluid, for example to drive chemical reactions, to provide heating for homes, offices or other areas, or for other purposes.

As the coating is oxidized, metal ferrite spinel is regenerated, and the resulting coated substrate can be recycled back into the reduction step and re-used.

The various coated substrates of the invention may also be useful for other applications. These surface coatings often have catalytic properties, and thus the coated materials can be used as catalysts in various chemical reactions. Another reaction of note is the reaction of hydrogen and carbon monoxide to produce hydrocarbons.

The coated particles often are magnetic, due at least in part to the presence of the iron oxide and/or cobalt oxide coating. They can therefore be used in applications for which magnetic particles are required.

Certain coated particles made in accordance with the invention can be sintered to form fabricated, dense ceramic, cermet or hardmetal parts. For example, particles prepared with a cobalt oxide film can be sintered in the presence of hydrogen, for example, to produce a variety of ceramic materials. The underlying particle may be a sinterable material by itself, in which case the iron oxide and/or cobalt oxide coating may act as a sintering aid. Examples of such sinterable particles include tungsten carbide, titanium carbide and molybdenum carbide particles.

EXAMPLE 1

Deposition of amorphous and crystalline iron oxide on 26 nm $ZrO_2$ particles is performed in a stainless steel fluidized bed reactor. The reactor is 3.5 cm in diameter and includes a 10 µm stainless steel (SS) distributor plate at the inlet to prevent particles from leaving the reactor while allowing gas to pass through freely. The outlet includes a 10 µm SS filter which prevents particles from elutriating out of the reactor. MKS Baratron® D28B Dual-Range Manometers monitor the pressure at the reactor inlet and outlet in order to determine the pressure drop across the reactor. MKS Mass-Flo® controllers in conjunction with Swagelok™ brand diaphragm sealed pneumatic valves are used to control gas flow throughout the reactor. Reduced pressure is achieved using an Adixen™ Standard Pascal Series Rotary Vane Pump. Effluent gases are measured using a Stanford Research Systems QMS series mass spectrometer.

Fluidization is accomplished at reduced pressure in conjunction with a mechanical vibrating table. Pressure drop across the bed is measured as a function of nitrogen flow rate in order to determine an adequate pressure drop required to maintain fluidization throughout the ALD cycle.

The ALD cycle consists of dosing ferrocene (99% purity acquired from Alfa Aesar®) and high purity oxygen (99.9%) in alternate doses into the reactor at 450° C. The first step consists of dosing ferrocene at 60° C. Nitrogen is employed as a carrier gas due to the low vapor pressure of ferrocene at that temperature. The reactor is then purged with nitrogen in order to remove any excess ferrocene from the reactor. Once purged, oxygen is dosed, followed by another nitrogen purge. All lines are heated to 60° C. in order to prevent any vaporous ferrocene from condensing.

In Situ mass spectrometry indicates that the chemistry is self-limiting, which is characteristic of an ALD reaction. When ferrocene is dosed into the reactor, there is an increase in the partial pressure of atomic mass 44. Soon after, the partial pressure of ferrocene begins to increase and eventually reaches a maximum, while the partial pressure of mass 44 decreases back to its original value, indicating that the surface is saturated and the reaction has completed. After the reactor is purged, oxygen is dosed and the partial pressure of both atomic mass 44 and oxygen increase. As oxygen continues to be dosed, the reaction product begins to decrease, indicating that the reaction in complete. During both precursor A and B doses, it is apparent that the reactions are self limiting because the reaction products increase and then decrease back to their original values while the reactants are still being dosed. If these reactions were not self-limiting, the products would continue to be generated as long as the reactants are dosed.

A JEOL 2010F Schottky field emission transmission electron microscope (TEM) at 200 kV is used to analyze the conformality of the deposited films after 200 coating cycles. TEM images clearly indicate that the films are conformal and uniform around all of the particles. The films are about 3 nm thick, corresponding to a growth rate of 0.15 Å per cycle, which is comparable to the growth rates of other metal oxides in ALD processes. On TEM, it appears as though some of the particles are aggregated due to large cohesive forces typically observed between nanoparticles. However, each particle has been coated individually, rather than the aggregate of particles being coated as a whole.

Energy dispersive spectroscopy (EDS) and x-ray diffraction (XRD) analysis confirm the presence of an amorphous iron oxide film on the surface of the zirconia particles.

Because the as-coated film is amorphous, samples of the coated particles are separately heat treated in both air and an inert environment at 850° C. for four hours in an effort to crystallize the iron oxide films. XRD and X-ray photoelectron spectroscopy (XPS) analysis confirms that $\alpha$-$Fe_2O_3$ films are present in the heat-treated samples.

EXAMPLE 2

Cobalt oxide is deposited onto zirconia particles in the same manner as described in Example 1, using cobaltocene (Bis(cyclopentadienyl)cobalt(II) acquired from Sigma Aldrich®) and oxygen as the precursor materials. The reactor configuration, particles, and fluidization conditions are all identical and are described above.

The ALD cycle consists of dosing cobaltocene and high purity oxygen (99.9%) in alternate doses into the reactor at 450° C. The first step consists of dosing cobaltocene at 60° C. Nitrogen is employed as a carrier gas due to the low vapor pressure of cobaltocene at that temperature. The reactor is then purged with nitrogen in order to remove any excess cobaltocene. Once purged, oxygen is dosed, followed by another nitrogen purge to complete an ALD cycle.

In Situ mass spectrometry indicates that the chemistry is self-limiting, which is characteristic of an ALD reaction.

Induced coupled plasma—atomic emission spectroscopy results after 200 coating cycles indicate a film thickness of 4.66-4.85 nm, corresponding to a growth rate of 0.233-0.243 angstroms/cycle. Film thickness is calculated assuming perfectly spherical particles of 26 nm, a $ZrO_2$ density of 5.6 g/cm$^3$, and a film density of 6.4 g/cm$^3$.

XRD analysis indicates that the deposited film is amorphous. Therefore, duplicate samples of the coated particles are heat treated in an inert environment at 850° C. for four hours to crystallize the film. This was done in order to determine whether cobalt metal or cobalt oxide was deposited. XRD analysis of the heat-treated films indicates that the films have been converted to a crystalline structure indicative of CoO.

EXAMPLE 3

Deposition conditions for $Co_xFe_yO_z$ are identical to the aforementioned conditions of both ferrocene and cobaltocene. However, rather than cycles consisting of an ABAB pattern, where A is ferrocene or cobaltocene and B is oxygen, one cycle would consist of an $(AB)_x(CB)_y$ pattern, where A is ferrocene, B is oxygen, C is cobaltocene, and X and Y represent the number of repetitions per cycle. For example, if one were to desire a film with a 3 to 1 ratio of iron to cobalt, one cycle would consist of ABABABCB, or $(AB)_3(CB)_1$.

Mixed $CoO/Fe_2O_3$ films are deposited onto zirconia particles. The deposition method is similar to those described in Examples 1 and 2, except that each reaction cycle consists of the following sequence of steps, each separated by a nitrogen purge:
1. Ferrocene
2. Oxygen
3. Ferrocene
4. Oxygen
5. Cobaltocene
6. Oxygen One hundred ninety-eight reaction cycles are performed. Induced coupled plasma—atomic emission spectroscopy (ICP-AES) analysis indicates that cobalt is present in the coated particles at a concentration of 5,006 ppm whereas iron is present at a concentration of about 10,828 parts per million. This corresponds to a stoichiometry of $Co_{0.95}Fe_{2.95}O_4$ and a mass loading of 2.18%.

XRD analysis indicates that the deposited films are amorphous. Therefore, a sample of the coated particles is heat treated in an inert environment at 850° C. for four hours in an effort to crystallize the film. XRD analysis shows that this heat treatment produces a crystalline spinel oxide, indicative of $Co_xFe_{3-x}O_4$.

EXAMPLE 4

Multilayers of iron(III) oxide and cobalt(II) oxide are deposited onto porous $Al_2O_3$ substrates (BET surface area=2.62 m$^2$/g) via ALD in the general manner described in Example 3. 70 reaction cycles are used, in which each cycle consists of two subcycles of ferrocene/oxygen and one subcycle of cobaltocene/oxygen. The samples are then calcined at 900° C. in a $N_2$ atmosphere in order to crystallize the film and enhance the solid state diffusion of the oxides to form cobalt ferrite spinel. The formation of a cobalt ferrite spinel having the approximate formula $Co_{1.11}Fe_{1.89}O_4$) is confirmed by X-ray Diffraction (XRD). Inductively coupled plasma-atomic emission spectroscopy (ICP-AES) results confirmed that the stoichiometry is consistent with cobalt ferrite spinel. The loading of the cobalt ferrite spinel on the alumina particles is 22 wt %.

Water splitting cycles are conducted in a high temperature horizontal furnace. The coated substrate is placed in a $ZrO_2$ boat in the center of a horizontal tube furnace, and a constant flow of $N_2$ is used to purge the reactor. Deionized $H_2O$ is delivered to a vaporizer using a syringe pump and $N_2$ is used to help carry the water vapor into and through the reactor. All unreacted water vapor is caught in a cold trap at the outlet of the reactor, and all other product gases were measured in situ using a Stanford Research Systems QMS series mass spectrometer.

The furnace is heated and a nitrogen stream is introduced into the reactor. As the temperature increases to 1000° C., oxygen evolution begins to occur and reaches a maximum rate when the temperature reaches 1350° C. After holding the temperature at 1400° C. for 20 minutes, the temperature is decreased to 1000° C. and the water vapor is dosed into the reactor. Almost immediately a sharp $H_2$ peak is observed.

Multiple redox cycles are attempted using the same sample, at a reduction temperature of 1200° C. and an oxidation temperature of 1000° C. Ten cycles are completed with little change in hydrogen generation rates among the runs. The total amount of hydrogen generated varies by up to 20% from one reaction cycle to the next, but there is no general downward trend in hydrogen production that would indicate that the sample is becoming deactivated. The ability to conduct the reduction step effectively at 1200° C. may be due in part to the choice of an alumina substrate. XRD analysis indicates that an $FeAl_2O_4$ species is formed during the reduction step, and that alumina and $CoFe_2O_4$ are re-formed during the oxidation step. This indicates that the substrate in this case is participating in the reactions that occur during the thermal reduction step, which is contrary to the typical reduction reaction which would produce CoO and FeO.

The invention claimed is:

1. A coated substrate having a metal ferrite spinel coating of from 1 nm to 10 nm in thickness deposited on at least a portion a surface of the substrate by an atomic layer deposition process and covalently bonded to the substrate, wherein the substrate is in the form of 20 nm to 500 nm particles that are thermally and oxidatively stable to a temperature of at least 900° C., and has a BET surface area of at least 10 m$^2$/g, and metal ferrite spinel has the empirical formula $M_xFe_{3-x}O_4$, wherein M is Mn, Zn, Co or Ni and x is a number from 0.25 to 1.5.

2. The coated substrate of claim 1, wherein the metal ferrite spinel coating is formed by applying iron oxide and a metal M oxide to the substrate via the atomic layer deposition process.

3. The coated substrate of claim 2 wherein the metal ferrite spinel coating is formed by heat treating one or more layers of iron oxide, metal M oxide or both that are applied by an atomic layer deposition process.

4. The coated substrate of claim 1 wherein the metal ferrite spinel coating is formed by applying iron oxide via the atomic layer deposition process to a substrate having a metal M oxide surface.

5. The coated substrate of claim 1 wherein the metal ferrite spinel coating is formed by applying a metal M oxide via the atomic layer deposition process to a substrate having an iron oxide surface.

6. The coated substrate of claim 1, wherein the metal M is cobalt.

7. The coated substrate of claim 1 wherein the substrate is alumina or alumina-containing.

* * * * *